United States Patent [19]
Endo et al.

[11] Patent Number: 5,472,826
[45] Date of Patent: Dec. 5, 1995

[54] SEMICONDUCTOR DEVICE FABRICATION METHOD

[75] Inventors: Masayuki Endo; Teruhito Ohnishi, both of Osaka; Noboru Nomura, Kyoto, all of Japan

[73] Assignee: Matsushita Electric Industrial Co., Ltd., Osaka, Japan

[21] Appl. No.: 193,550

[22] Filed: Feb. 8, 1994

[30] Foreign Application Priority Data

Feb. 22, 1993 [JP] Japan ................................. 5-031856

[51] Int. Cl.$^6$ .................................................... G03F 7/26
[52] U.S. Cl. ......................... 430/311; 430/328; 430/329; 430/330
[58] Field of Search ....................... 430/311, 322, 430/328, 329, 330, 331

[56] References Cited

U.S. PATENT DOCUMENTS 4,617,251 10/1986 Sizensky ............................... 430/258
5,219,711 6/1993 Anderson ............................. 430/311

Primary Examiner—Kathleen Duda
Attorney, Agent, or Firm—Willian Brinks Hofer Gilson & Lione

[57] ABSTRACT

An improved semiconductor device fabrication technique is disclosed. A resist layer, composed of a chemical compound which generates an acid when exposed to energy light and a resin which contains protecting groups that are removed from the resin by acid, is formed on top of a semiconductor substrate. The resist layer is subjected to a lithography and a development process and is formed into a resist pattern. This resist pattern is exposed to ultraviolet beams, and the chemical compound generates an acid and the protecting groups are removed from the resin. As a result of such an elimination reaction, the surface of the resist pattern becomes coarse. Thereafter, an implant of ions is carried out to the semiconductor substrate using the resist pattern as a mask. The surface of the semiconductor substrate is cleaned using a cleaning solution, and the resist pattern with a coarse surface can easily and completely be removed from the semiconductor substrate.

8 Claims, 3 Drawing Sheets

SEMICONDUCTOR DEVICE FABRICATION METHOD

TECHNICAL FIELD OF THE INVENTION

This invention relates to a method of fabricating semiconductor devices.

BACKGROUND OFT HE INVENTION

In the manufacture of semiconductor devices, a resist pattern formed on a semiconductor substrate is removed after an implant of ions has been carried out. The ion implantation, particularly when carried out at a high dose, causes the surface of the resist pattern to harden, and removal of such a resist pattern with a hardened surface cannot be done by using a usual cleaning acidic solution. Therefore, dry ashing with the help of a gas of $O_2$ is used. This dry ashing technique, however, cannot achieve complete removal of every resist pattern formed on the semiconductor substrate.

Referring now to FIGS. 3a to 3f, one of the conventional semiconductor device fabrication techniques is described.

Formed on a semiconductor substrate 10 is a 1.5 μm-thick resist layer 11 (see FIG. 3a). This resist layer 11 is formed by a novolac resin and naphthoquinonediazide (i.e. TSMR-V3, a product of Tokyo Ohka Kogyo Co., Ltd.) and is used for forming resist patterns for usual ion implantations.

As shown in FIG. 3b, an i-line stepper (NA: 0.50), not shown, gives off i-line indicated by arrows 13 so that the resist layer 11 is exposed to the i-line 13 through an ion implantation mask 12 having a predetermined pattern.

Next, the resist layer 11 is subjected to a heating process as well as to a developing process, and is formed into a resist pattern 11'.

As shown in FIG. 3d, with using the resist pattern 11' as a mask, an implant of $As^+$ ions, indicated by arrows 14, is carried out to the semiconductor substrate 10 at a high dose of ($1\times10^{16}$). As described previously, such a high-dose ion implantation causes the surface of the resist layer's 11' to deteriorate or harden, and thus the resist pattern 11' cannot be removed by a sulfuric acid solution.

Therefore, a dry ashing process using $O_2$, indicated by arrows 15, is performed to remove the resist pattern 11' (see FIG. 3e).

Although most of the resist pattern 11' are removed by the dry ashing process 15, the semiconductor substrate 11' still suffers from some unwanted residues/particles 16(see FIG. 3f).

The residues/particles 16 become a defect cause at later processing steps, thereby decreasing the yield of semiconductor devices.

In order to remove the residues/particles 16 lingering on the semiconductor substrate 10, the surface of the semiconductor substrate 10 can be rinsed using an acidic cleaning solution. However, this only worsens the already worsened throughput due to the previous dry ashing process, and process costs cannot be held low because the dry aching process and the cleaning process are additionally involved. Therefore, it is preferable not to use acidic cleaning solutions to remove a resist residue.

SUMMARY OF THE INVENTION

Bearing in mind the above-described problems accompanied with the prior art techniques, the present invention was made aiming at providing an improved semiconductor device fabrication method capable of easily removing a residual resist left after an implant of ions has been carried out.

The present invention discloses a semiconductor device fabrication method. In this technique, a resist layer, composed of (a) a chemical compound which generates an acid when exposed to energy light and (b) a resin which contains protecting groups that can be removed by acid from the resin, is formed on top of a semiconductor substrate. The resist layer is then formed into a resist pattern, thereafter being exposed to energy light to allow the chemical compound to generate an acid. The protecting groups attached to the resin are eliminated. As a result of such elimination, the surface of the resist pattern becomes coarse.

More specifically, the above-described fabrication method comprises: (a) a first step of forming on a semiconductor substrate a photoresist layer composed of a chemical compound which generates an acid when exposed to beams of energy light and a resin which contains protecting groups that can be removed from the resin by an acid, (b) a second step of forming a resist pattern by subjecting the photoresist layer to a lithography process as well as to a developing process through a mask having a predetermined pattern, (c) a third step of illuminating the photoresist pattern with beams of energy light and carrying out an implant of ions to the semiconductor substrate, and (d) a fourth step of removing the photoresist pattern from the semiconductor substrate by a cleaning solution.

When the protecting groups are removed from the resin, this leaves fine openings in the resin. The surface of the resist pattern becomes coarse, and even if a high-dose ion implantation is carried out using the resist pattern as a mask, the resist pattern can be removed easily from the semiconductor substrate because cleaning solutions such as an alkali solution and a sulfuric solution can enter deep into the resist pattern.

Unlike the prior art techniques, the present invention can easily remove resist patterns after an implant of ions has been carried out thereby improving the throughput and process costs. The productivity and yield of semiconductor devices, as a result, is improved.

In the above-described method, the third step may include first illuminating the photoresist pattern with beams of energy light and thereafter carrying out an implant of ions to the semiconductor substrate using the photoresist pattern as a mask.

In the above-described method, the third step may include first carrying out an implant of ions to the semiconductor substrate using the photoresist pattern as a mask and thereafter illuminating the photoresist pattern with beams of energy light.

In the above-described method, the resin containing the protecting groups is characterized in that it becomes alkali-soluble when an acid causes the protecting groups to be removed from the resin, and the cleaning solution is an alkaline cleaning solution.

When the resist pattern is cleaned with an alkali solution, the alkali solution is very much likely to enter the resist pattern. Therefore, resist-pattern removal can be done by using a cleaning solution at room temperature.

In the above-described method, the resin includes those obtained by adding protecting groups to polyvinyl phenol, to a polyvinyl phenol copolymer, to a novolac resin, and to a novolac resin copolymer.

In the above-described method, the protecting groups include tert-butyl groups, tert-butyloxycarboxyl groups, tetrahydropyranyl groups, and tri-methyl silyl groups.

In the above-described method, the chemical compound includes onium salts, sulfonic-acid generating chemical compounds, carboxylic-acid generating chemical compounds, and triazine chemical compounds.

In the above-described method, the step of illuminating the photoresist pattern with beams of energy light of the third step may be carried out in an atmosphere of oxygen.

Since the surface of the resist pattern is etched by atoms of ozone or atoms of oxygen when exposed to beams of energy light, this allows for a cleaning solution to remove the resist more easily from the semiconductor substrate.

DETAILED DESCRIPTION OF THE INVENTION

Embodiment 1

Referring now to FIGS. 1a to 1f, a first preferred embodiment of the invention is explained.

Figure 1A:
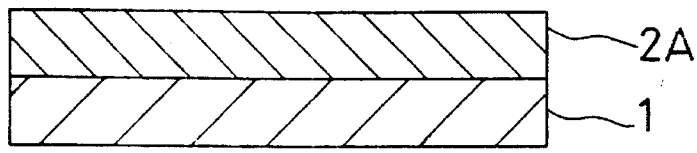
FIGS. 1a to 1f cross-sectionally show processing steps of the fabrication of a semiconductor device according to a first preferred embodiment of the present invention.

Formed on a semiconductor substrate 1 is a 1.5 µm-thick resist layer 2A (see FIG. 1a). The resist layer 2A contains a chemical compound which generates an acid when exposed to energy light, a resin that becomes alkali-soluble when protecting groups attached to the resin are eliminated or removed by acid, and a solvent. More specifically, the composition of the resist layer 2A is as follows:

*poly (tert-butyl-oxystylene): 10 g

**triphenyl sulfonium antimonate: 1 g

***diethylene glycol dimethylether: 50 g

Figure 1B:
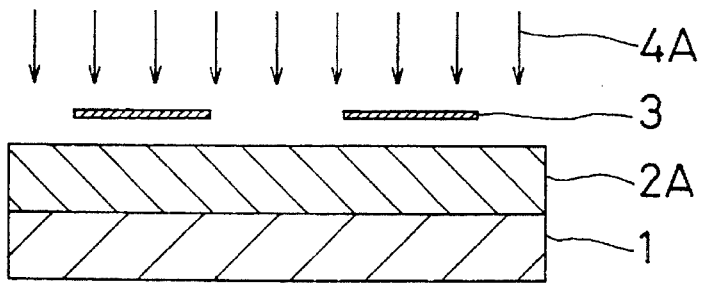

Notes: *=resin containing protecting groups that are eliminated by acid;
**=chemical compound that generates an acid when exposed to beams of energy light; and
***=solvent Next, as shown in FIG. 1b, an i-line stepper (NA: 0.50), not shown, gives off i-line indicated by arrows 4A so that the resist layer 2A is exposed to the i-line 4A through an ion implantation mask 3 having a predetermined pattern.

Figure 1C:
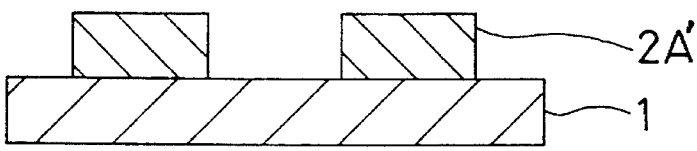

The resist pattern 2A then undergoes a heating process and a developing process and is formed into a resist pattern 2A' of a positive type (see FIG. 1c).

Figure 1D:
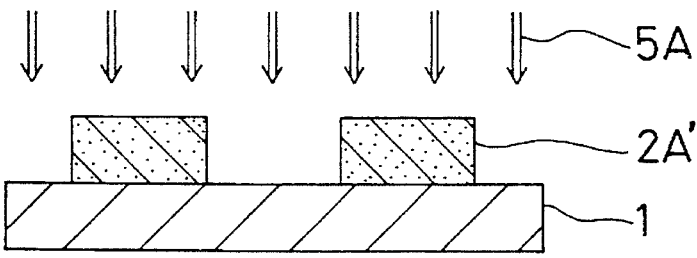

Next, as shown in FIG. 1d, the resist pattern 2A' is exposed to ultraviolet rays indicated by arrows 5A. As a result, the chemical compound contained in the resist pattern 2A' generates an acid. The acid thus generated causes the protecting groups added to the resin to be eliminated. The surface of the resist pattern 2A' becomes coarse as a result, and the resist pattern 2A' becomes alkali-soluble.

Figure 1E:
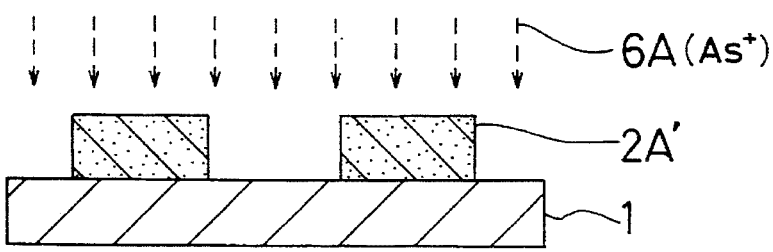

Using the resist pattern 2A' as a mask, an implant of $As^+$ ions, indicated by arrows 6A, is carried out to the semiconductor substrate 1 at a high dose of ($1\times10^{16}$) (see FIG. 1e).

Figure 1F:

As shown in FIG. 1f, the resist pattern 2A', which is now alkali soluble, is subjected to cleaning by an alkali solution at room temperature. In spite of the fact that the surface of the resist pattern 2A' is deteriorated due to the high-dose ion implantation, complete removal of the resist pattern 2A' from the semiconductor substrate 1 is achievable because the surface of the resist pattern 2A' becomes rough and alkali-soluble. Semiconductor devices fabricated according to the present embodiment were examined, and it was observed that no residues nor particles had been left on top of the semiconductor substrates at all.

In this embodiment, an alkali solution is used, which, however, is not to be considered restrictive. The same effects as obtained by using the alkali solution may be expected by using a sulfuric acid solution, a hydrogen peroxide solution, or a mixture of them heated.

Embodiment 2

Referring now to FIGS. 2a to 2f, a second preferred embodiment of the invention is described below.

Figure 2A:
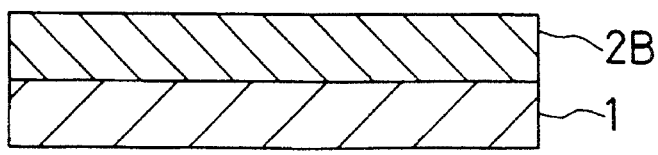
FIGS. 2a to 2f cross-sectionally show processing steps of the fabrication of a semiconductor device according to a second preferred embodiment of the present invention.

Formed on the semiconductor substrate 1 is a 1.5 µm-thick resist layer 2B (see FIG. 2a). The resist layer 2B contains a chemical compound which generates an acid when exposed to energy light beams, a resin that becomes alkali-soluble when protecting groups attached to the resin are eliminated by acid, and a solvent. More specifically, the composition of the resist layer 2B is as follows:

*poly (ethoxy) ethoxystylene: 10 g

**2-diazo-1,3-(dicyclohexyl) disulfon: 0.5 g

***diethylene glycol dimethylether: 50 g

Figure 2B:
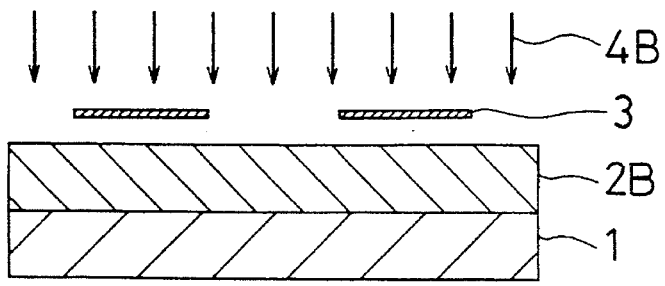

Notes: *=resin containing protecting groups that are eliminated by acid;
**=chemical compound that generates an acid when exposed to beams of energy light; and
***=solvent Next, as shown in FIG. 2b, a KrF excimer laser stepper (NA: 0.45), not shown, gives off excimer laser beams indicated by arrows 4B so that the resist layer 2B is exposed to the excimer laser beam 4B through the ion implantation mask 3 having a predetermined pattern.

Figure 2C:
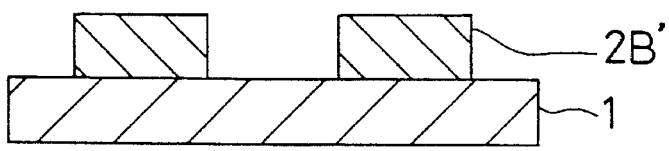
Figure 2D:
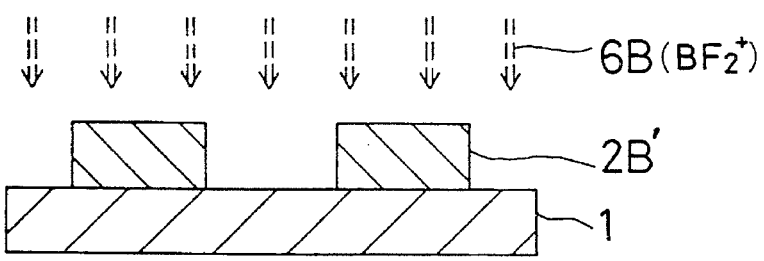

The resist layer 2B then is subjected to a heating process and a developing process and is formed into a resist pattern 2B' of a positive type (see FIG. 2c).

Using the resist pattern 2B' as a mask, an implant of $BF_2^+$ ions, indicated by arrows 6B, is carried out to the semiconductor substrate 1 at a high dose of ($1\times10^{16}$) (see FIG. 1d).

Figure 2E:
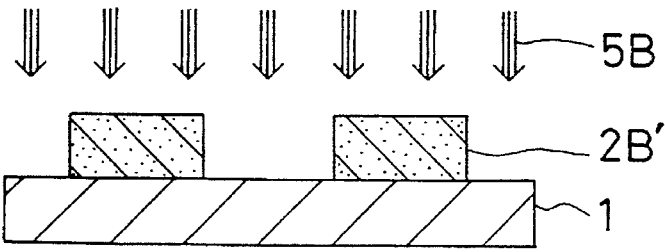

Next, as shown in FIG. 2e, the resist pattern 2B' is exposed to deep ultraviolet rays indicated by arrows 5B. This exposure causes the chemical compound contained in the resist pattern 2B' to generate an acid. Then, the acid thus generated causes the protecting groups added to the resin to be eliminated. The resist pattern 2B' becomes alkali-soluble, and the eliminated protecting groups become ethoxylethylene compounds. Due to these ethoxylethylene compounds, the surface of the resist pattern 2B', which has been deteriorated by the high-dose ion implantation, is made coarse from the inside.

Figure 2F:
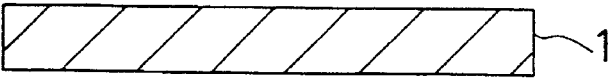
Figure 3A:
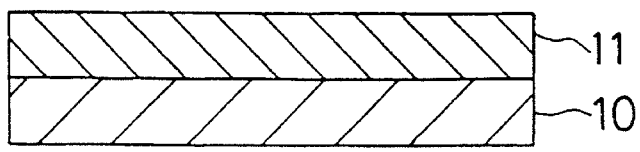
FIGS. 3a to 3f cross-sectionally show processing steps of the fabrication of a semiconductor device according to a conventional technique.
Figure 3B:
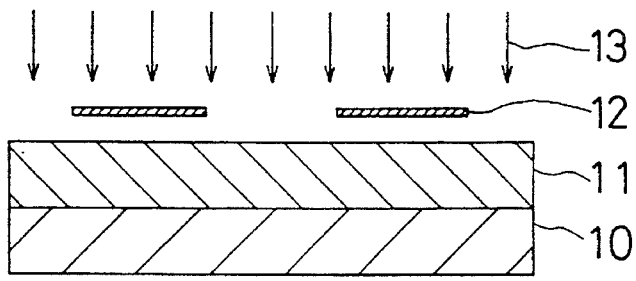
Figure 3C:
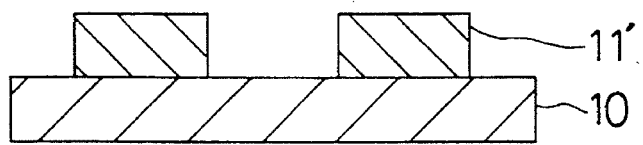
Figure 3D:
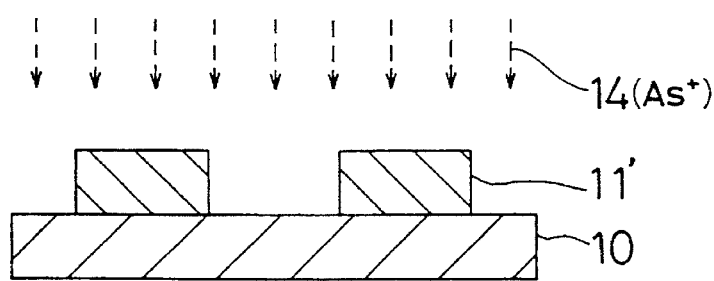
Figure 3E:
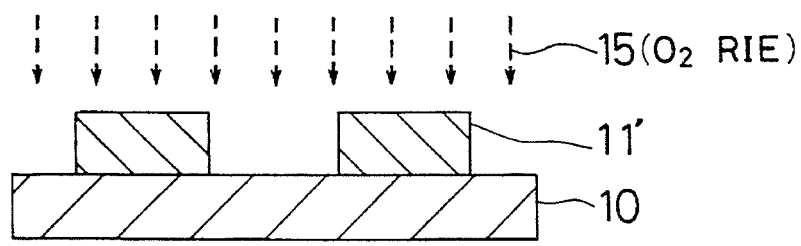
Figure 3F:
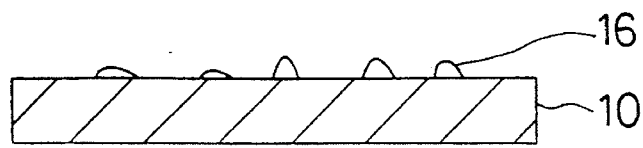

As shown in FIG. 2f, the surface of the resist pattern 2B' is subjected to cleaning by an alkali solution. In spite of the fact that the surface of the resist pattern 2B' is deteriorated due to the high-dose ion implantation, complete removal of the resist pattern 2B' from the semiconductor substrate 1 is achievable because the alkali solution easily enters deep into the resist pattern 2B' because the surface of the resist pattern 2B' is rough and the resist pattern 2B' is alkali-soluble. Semiconductor devices fabricated according to the present embodiment were examined, and it was observed that no residues nor particles had been left on the semiconductor substrates at all. In this embodiment, an alkali solution is used, which, however, is not to be considered restrictive. The same effects as obtained by using the alkali solution may be obtained by using a sulfuric acid solution, a hydrogen peroxide solution, or a mixture of them heated.

Additionally, if the resist pattern 2A' of the first embodiment or the resist pattern 2B' of the second embodiment is exposed to energy light beams in an atmosphere of oxygen, the surface of the resist pattern is somewhat etched away by atoms of ozone or oxygen. As a result, a cleaning solution is very much likely to penetrate the resist pattern, and thus this facilitates removal of the resist pattern by a cleaning solution.

In the embodiments of the present invention, ultraviolet rays or deep ultraviolet rays are used as the energy light beams. However, other types of energy light beams such as excimer laser beams, electron beams, and X-rays may be useful.

Furthermore, onium salts, sulfonic-acid generating chemical compounds, carboxylic-acid generating chemical compounds, or triazine chemical compounds may act as the chemical compound that generates an acid when exposed to energy light beams.

Further, the resin which is protected by protecting groups that are eliminated by acid includes those obtained by adding protecting groups to polyvinyl phenol, to a polyvinyl phenol copolymer, to a novolac resin, to a novolac resin copolymer. As the protecting group, tert-butyl groups, tert-butyloxycarboxyl groups, tetrahydropyranyl groups, or trimethyl silyl groups may be useful.

The invention claimed is:

1. A semiconductor device fabrication method comprising:
    a first step of forming on a semiconductor substrate a photoresist layer composed of a chemical compound which generates an acid when exposed to beams of energy light and a resin which contains protecting groups that can be removed from the resin by an acid,
    a second step of forming a photoresist pattern by subjecting said photoresist layer to a lithography process through a mask having a predetermined pattern, as well as a developing process,
    a third step of illuminating said photoresist pattern with beams of energy light and carrying out an implant of ions to said semiconductor substrate, and
    a fourth step of removing said photoresist pattern from said semiconductor substrate by a cleaning solution.

2. The semiconductor device fabrication method as in claim 1, wherein said third step includes first illuminating said photoresist pattern with beams of energy light and thereafter carrying out an implant of ions to said semiconductor substrate using said photoresist pattern as a mask.

3. The semiconductor device fabrication method as in claim 1, wherein said third step includes first carrying out an implant of ions to said semiconductor substrate using said photoresist pattern as a mask and thereafter illuminating said photoresist pattern with beams of energy light.

4. The semiconductor device fabrication method as in claim 1, wherein said resin containing said protecting groups is characterized in that it becomes alkali-soluble when an acid causes said protecting groups to be removed from said resin and said cleaning solution is an alkaline cleaning solution.

5. The semiconductor device fabrication method as in claim 1, wherein said resin includes those obtained by adding protecting groups to polyvinyl phenol, to a polyvinyl phenol copolymer, to a novolac resin, and to a novolac resin copolymer.

6. The semiconductor device fabrication method as in claim 1, wherein said protecting groups include tert-butyl groups, tert-butyloxycarboxyl groups, tetrahydropyranyl groups, and trimethyl silyl groups.

7. The semiconductor device fabrication method as in claim 1, wherein said chemical compound includes onium salts, sulfonic-acid generating chemical compounds, carboxylic-acid generating chemical compounds, and triazine chemical compounds.

8. The semiconductor device fabrication method as in claim 1, wherein the step of illuminating said photoresist pattern with beams of energy light of said third step is carried out in an atmosphere of oxygen.

* * * * *